US009497877B2

(12) United States Patent
Janssen et al.

(10) Patent No.: US 9,497,877 B2
(45) Date of Patent: Nov. 15, 2016

(54) ELECTRONIC DEVICE COMPRISING A CAPACITOR IN A HOLDER FOR A CIRCUIT BOARD AND METHOD FOR PRODUCTION THEREOF

(71) Applicant: SMA Solar Technology AG, Niestetal (DE)

(72) Inventors: Eberhard Janssen, Kassel (DE); Volker Marschang, Kassel (DE); Burkhard Roecher, Kaufungen (DE)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 396 days.

(21) Appl. No.: 14/179,811

(22) Filed: Feb. 13, 2014

(65) Prior Publication Data

US 2014/0160704 A1    Jun. 12, 2014

Related U.S. Application Data

(63) Continuation of application No. PCT/EP2012/065083, filed on Aug. 1, 2012.

(30) Foreign Application Priority Data

Aug. 15, 2011 (DE) .......... 10 2011 110 135
May 18, 2012 (DE) .......... 10 2012 104 319

(51) Int. Cl.
*H05K 7/14*    (2006.01)
*H01G 2/06*    (2006.01)
(Continued)

(52) U.S. Cl.
CPC .............. *H05K 7/1417* (2013.01); *H01G 2/06* (2013.01); *H01G 2/106* (2013.01); *H02M 7/003* (2013.01);
(Continued)

(58) Field of Classification Search
CPC .................. H01G 2/106; H05K 7/1417; H05K 7/01
(Continued)

(56) References Cited

U.S. PATENT DOCUMENTS 2,326,152 A * 8/1943 Marbury ................. H01G 2/08
                                                        361/274.2
4,518,646 A    5/1985 Nichols, Jr.
(Continued)

FOREIGN PATENT DOCUMENTS

EP    1056318 A2    11/2000
EP    1418798 A2    5/2004
(Continued)

OTHER PUBLICATIONS

International Search Report dated Sep. 3, 2013 for International application No. PCT/EP2012/065083.

*Primary Examiner* — David Warren
(74) *Attorney, Agent, or Firm* — Eschweiler & Associates, LLC

(57) ABSTRACT

An electronic device includes a housing, a circuit board, a plurality of holders having mechanical connectors to the housing and to the circuit board and mechanically fixing the circuit board within the housing, and at least one capacitor having a first electrode, a second electrode and a dielectric arranged between the first and second electrodes. The first electrode is electrically connected to a contact on the circuit board, and the second electrode is electrically connected to the housing. The at least one capacitor is part of one of the plurality of holders; and the dielectric of the capacitor is part of a thermal insulation between the connectors to the circuit board and to the housing.

16 Claims, 11 Drawing Sheets

(51) Int. Cl.
    *H02M 7/00*     (2006.01)
    *H01G 2/10*     (2006.01)
    *H01G 2/14*     (2006.01)
    *H05K 1/02*     (2006.01)
    *H05K 3/22*     (2006.01)
    *H05K 3/30*     (2006.01)
    *H05K 3/32*     (2006.01)

(52) U.S. Cl.
    CPC .......... *H05K 1/0215* (2013.01); *H05K 1/0254* (2013.01); *H05K 7/14* (2013.01); *H01G 2/14* (2013.01); *H05K 1/0201* (2013.01); *H05K 1/0231* (2013.01); *H05K 1/0268* (2013.01); *H05K 3/222* (2013.01); *H05K 3/301* (2013.01); *H05K 3/325* (2013.01); *H05K 2201/049* (2013.01); *H05K 2201/10015* (2013.01); *H05K 2201/10242* (2013.01); *H05K 2201/10303* (2013.01); *H05K 2201/10409* (2013.01); *H05K 2201/10454* (2013.01); *H05K 2201/10492* (2013.01); *Y10T 29/49004* (2015.01)

(58) Field of Classification Search
    USPC .................................................. 361/752, 763
    See application file for complete search history.

(56) References Cited

U.S. PATENT DOCUMENTS

| | | | | |
|---|---|---|---|---|
| 4,581,795 A | * | 4/1986 | Mobbs | H01G 4/258 29/25.42 |
| 4,967,316 A | * | 10/1990 | Goebel | B60R 16/0239 174/261 |
| 6,016,084 A | | 1/2000 | Sugimoto | |
| 7,239,499 B2 | * | 7/2007 | Hsieh | H01G 2/08 361/274.1 |
| 7,480,150 B2 | * | 1/2009 | Kariya | H01L 21/4857 361/760 |
| 7,869,221 B2 | * | 1/2011 | Knight | G01R 31/3025 361/760 |
| 8,124,883 B2 | * | 2/2012 | Chikagawa | B32B 18/00 174/250 |
| 8,148,645 B2 | * | 4/2012 | Yoshikawa | H05K 1/162 174/260 |
| 2003/0063417 A1 | | 4/2003 | Pereira et al. | |
| 2003/0156003 A1 | * | 8/2003 | Sortor | H01F 19/04 336/200 |
| 2007/0211386 A1 | | 9/2007 | Yang et al. | |
| 2007/0236883 A1 | * | 10/2007 | Ruiz | H01L 23/473 361/699 |
| 2012/0001566 A1 | * | 1/2012 | Josefowicz | H05B 33/0851 315/291 |
| 2013/0182372 A1 | * | 7/2013 | Shepard | H01G 2/08 361/307 |
| 2014/0160704 A1 | * | 6/2014 | Janssen | H01G 2/06 361/759 |
| 2015/0016023 A1 | * | 1/2015 | Le Bihan | H01G 2/10 361/502 |
| 2015/0134039 A1 | * | 5/2015 | Marzano | A61N 1/3754 607/116 |
| 2015/0314131 A1 | * | 11/2015 | Stevenson | A61N 1/3754 174/650 |
| 2016/0005544 A1 | * | 1/2016 | Jakoubovitch | H01G 4/32 361/301.3 |

FOREIGN PATENT DOCUMENTS

| | | |
|---|---|---|
| JP | S6096959 A | 5/1985 |
| JP | 11252937 A | 9/1999 |

* cited by examiner

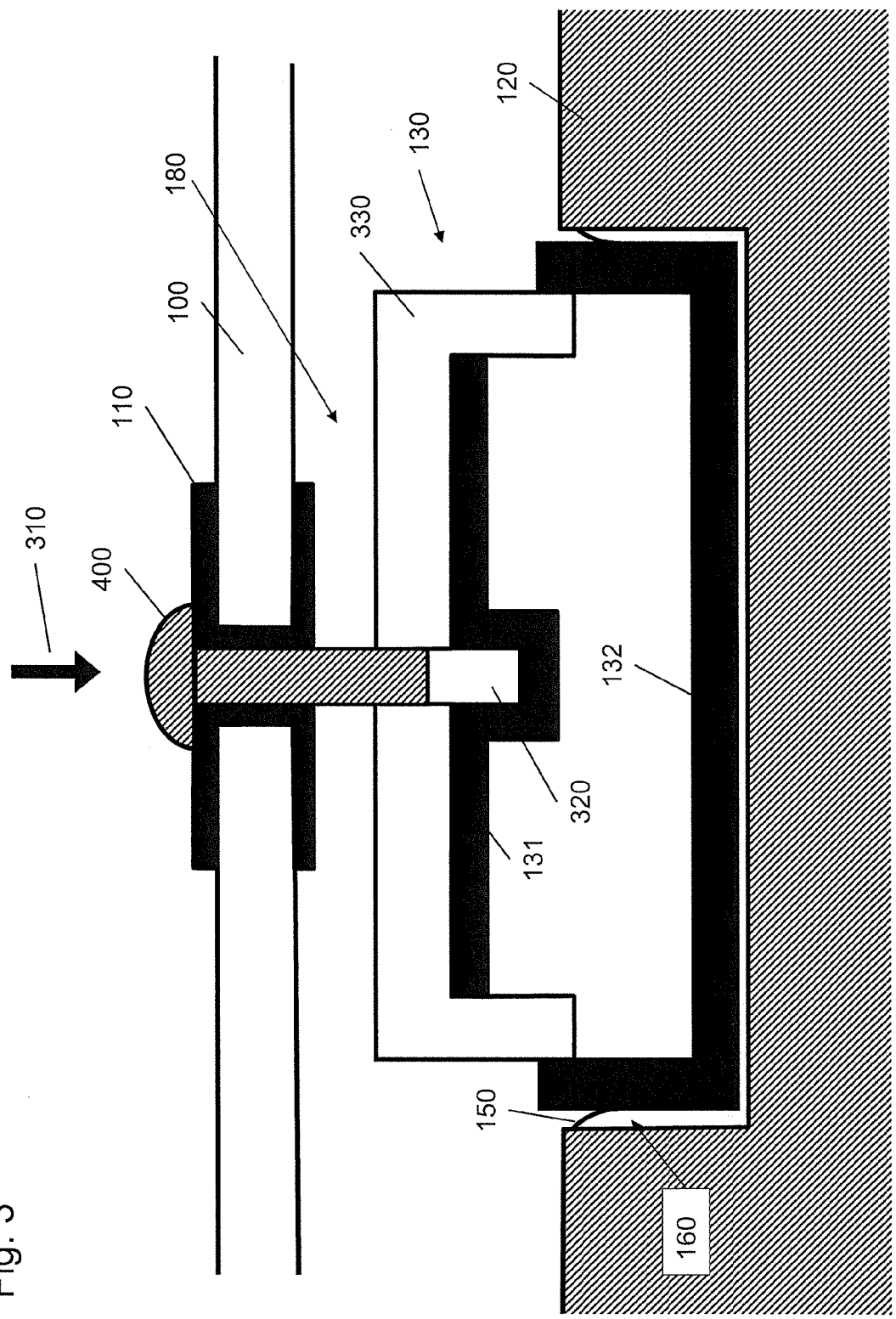

ELECTRONIC DEVICE COMPRISING A CAPACITOR IN A HOLDER FOR A CIRCUIT BOARD AND METHOD FOR PRODUCTION THEREOF

CROSS-REFERENCE TO RELATED APPLICATIONS

This application is a continuation application of PCT/EP2012/065083, filed on Aug. 1, 2012, which claims priority to German Patent Applications Nos. DE 10 2011 110 135.0, filed on Aug. 15, 2011, and DE 10 2012 104 319.1, filed on May 18, 2012, and both entitled "Elektronisches Gerät mit Kondensator als Haltevorrichtung für eine Leiterplatte und Verfahren zu dessen Herstellung".

FIELD

The present disclosure relates to an electronic device comprising a circuit board. More particularly, the present disclosure relates to a device operating at high voltage differences on the circuit board. Such a device may, for example, be an inverter for a photovoltaic power system or a DC/DC converter. Further, the disclosure relates to a method of manufacturing such an electronic device.

BACKGROUND

Electronic devices, particularly inverters for photovoltaic (PV) power systems have to fulfil a number of requirements. The desire for a high efficiency of such electronic devices results in high switching frequencies of power semiconductor switches which are used in the devices. These high switching frequencies in turn result in problems with electromagnetic compatibility (EMC) as the emission of electromagnetic oscillations has to be kept below predetermined threshold values. For this purpose, filter capacitors are employed on circuit boards of the electronic devices to dampen such oscillations. Some of these filter capacitors are connected to a circuit path with their first electrode and to a reference potential, like for example earth potential, with their second electrode. Often, the earth potential is provided on the circuit board in such a manner that one or more earth contact points on the circuit board are electrically connected to a metallic housing of the device via a metallic screw connection. The circuit board may also be mechanically fixed within the housing via these screw connections.

This method of contacting and fixing, however, often results in the formation of so-called dendrites, particularly with electronic devices which are used outdoors and which operate at high voltage differences on the circuit board. These voltage differences may both be DC voltage differences and AC voltage differences, particularly low frequency AC voltage differences. Dendrites are depositions which are, for example due to dirt, formed between circuit paths with a voltage difference. A few volts are sufficient for the formation of dendrites; the formation of dendrites being enhanced by higher voltage differences. Often, the dendrites have a sufficiently high electrical conductivity to cause an undesired electrical connection between neighboring circuit paths so that the electronic device does no longer function properly. In an extreme case, a dendrite may cause a short circuit which results in serious damage or even a destruction of the entire device.

Dendrites are primarily formed under the influence of deposits of moisture which may be formed in the interior of a housing of the device, like for example due to a condensation of air moisture. The high voltage values in operation of the device may result in an electrochemical transformation of the condensate or a reaction of the condensate with components of the circuit board, like for example corrosion, and thus enhance the growth of dendrites. Cold places in the housing are particularly prone to condensation and formation of dendrites. As the above mentioned screw connections between the circuit board and the housing form thermal bridges, they are typical places of condensation and formation of dendrites.

A further problem in manufacturing electronic devices results from the conditions of a so-called high voltage test which has to be passed, for example, by inverters for PV systems especially for security reasons. Such a high voltage test is, for example, defined in DIN EN 62109-1. During a high voltage test, an electronic device is subjected to voltages whose values are essentially above the voltage values which are reached in the allowed operation of the device. The high voltage test serves for ensuring the effectiveness of the electrical isolation measures of the device. In the high voltage test it is not essential to also test the filter capacitors for EMC, if their voltage resistance has previously been proven in a test carried out by their manufacturer. However, the filter capacitors are—as a rule—already fixed to the circuit board when the high voltage test is executed so that the full high test voltage drops over them. If the filter capacitors are failing in the high voltage test, like for example by explosion, this results in the necessity of a repair or an exchange of components or even in a destruction of the entire device. In case of an unnoticed failure of a filter capacitor, the EMC specifications may not be fulfilled by the electronic device.

Thus, it is the problem of the present disclosure to provide an electronic device which displays a reduced failure probability due to formation of dendrites even if used outdoors, wherein, at the same time, a simple and cost-saving manufacture of the device is possible. Further, a damage to components of the device, particularly to EMC filter capacitors, should be avoided during high voltage tests carried out.

SUMMARY

The electronic device according to the disclosure includes a housing, a circuit board, holders comprising mechanical connectors to the housing and to the circuit board and fixing the circuit board within the housing, and at least one capacitor comprising a first electrode, a second electrode and a dielectric arranged between the electrodes. The first electrode is electrically connected to a contact on the circuit board and the second electrode is electrically connected to the housing. The at least one capacitor is part of one of the holders, its dielectric being part of a thermal insulation between the connectors of the holder to the circuit board and the housing. At the same time, the dielectric provides for an electrical isolation between the connectors.

The circuit board is mechanically fixed within the housing of the device by the holders; i.e., under all installation and operation conditions allowed, it is held in a defined position. At least one of the holders includes a capacitor, which is electrically connected to an associated contact on the circuit board with one of its two electrodes, whereas it is electrically connected to the housing made of an electrically conductive material, like for example a metal sheet or die cast material like aluminium or the like, with its other electrode.

The dielectric of the capacitor is part of a thermal insulation between the connectors of the holder to the circuit board and the housing. In the area of the thermal insulation, the holder may completely consist of this dielectric. Often however, the holder will comprise a not thermally conductive enclosure of the dielectric in the area of the thermal insulation. Additionally, a supporting structure made of an electrically isolating and thermally insulating material may be connected in parallel to the dielectric of the capacitor between the connectors. In such a supporting structure, a plug-in position may be formed for the capacitor. Further, the supporting structure may be a so-called small circuit board whose direction of main extension runs normal to the plane of main extension of the circuit board, and to which the capacitor may be soldered or placed in a plug-in position.

In any case, the capacitor should provide for thermally decoupling the connectors, this means that everything which is thermally connected in parallel to the capacitor may not be thermally conductive, i.e. at least not be of a high thermal conductivity and, in one embodiment, of no higher thermal conductivity than the capacitor (a clearly lower thermal conductivity is even better), so that no thermal short circuit between the circuit board and the housing is caused. It is appreciated that everything which is connected in parallel to the capacitor may also not provide a continuous electrically conductive path as otherwise the capacitor would be electrically short-circuited and thus be out of function.

Due to the integration of the capacitor in the holder it is also achieved that the potential of the housing, as a rule earth potential, is not applied directly to a point on the circuit board and does not have to be forwarded to such a point via a circuit path on the circuit board at earth potential. Thus, voltage differences between the various circuit board potentials and earth potential are not dropping on the circuit board over a comparatively short distance but outside the circuit board over the capacitor in the holder and thus—related to the conductors outside the capacitor—over a much longer distance. The voltage differences which may drop over the capacitor(s) in operation of the electronic device may be higher than 100 volts, particularly higher than 400 volts. With such voltages in general, dendrites may easily be formed following a formation of condensate due to changes of temperature and air moisture which are usually encountered in outdoor use.

By means of the thermally insulating holders for the circuit board in the electronic device according to the present disclosure, a formation of dendrites may effectively be inhibited as described above. This inhibiting effect is further enhanced by using capacitors with a low heat conductivity between their electrodes, like for example film capacitors.

In one embodiment, the circuit board is exclusively fixed by holders which comprise a thermal insulation between their mechanical connectors and which may each comprise a capacitor. For a reliable mechanical fixation, at least three holders are required which may then separately couple three contacts on the circuit board to the housing via their capacitors. In this way, for example, three anti-interference capacitances may be provided for circuit paths on the circuit board as they are often required in this number.

The mechanical connectors of the holder may simultaneously be intended for electrically connecting the capacitor to the contact on the circuit board and to the housing. Particularly, contact elements for pressing or screwing in or soldering may be provided for the formation of the electrical connection between the electrodes of the capacitor on the one hand and the circuit board or the device on the other hand. These contact elements may be made in one part with the capacitor or they may be provided as separate parts, i.e. as separate elements which are only pressed together or screwed together with the capacitor in use. Particularly, a contact pin or a contact screw may be used as a contact element which is still movable when the circuit board has already been mechanically fixed via the holders. This, for example, allows for purposefully connecting the one electrode of the capacitor to the contact on the circuit board at a later point in time.

A pressed electrical connection may be made in such a way that the elements pressed together may not be removed from each other without destruction. For this purpose, a contact pin may be used which has cutting edges and/or a teethed structure cutting into the metallic face to be contacted or plastically deforming this metallic face such that a mechanically stable and electrically reliable low-ohmic connection is made. Suitable structures for this purpose are known to those skilled in the art. A pressed connection allows for a quick, effortless and cheap mounting of the circuit board within the housing of the device.

In manufacturing an electronic device according to the present disclosure, in which at least one contact on a circuit board is electrically connected to the housing of the electronic device via a capacitor provided in a holder for the circuit board, the circuit board may at first be mechanically fixed within the housing by holders. In this step, the capacitor remains electrically separated at least from the housing or the contact on the circuit board. Afterwards, the electronic device is put under a high voltage test. By means of the electrical separation of at least one of the electrodes of the capacitor it is ensured that the capacitor is not loaded with a high voltage during this test and can thus not be damaged.

Only after finishing the high voltage test, the capacitor is completely electrically connected to both the contact on the circuit board and to the housing, i.e. an electrical connection between the up to now electrically separated electrode of the capacitor and the circuit board or the housing is made. This may, for example, be accomplished by pressing a contact pin into an associated contact opening or recess or by screwing a screw element, i.e. a contact screw, into an associated thread. In this way, besides providing the final electrical connection, the circuit board may additionally be mechanically secured to the housing. The basic mechanical fixation of the circuit board within the housing, however, has to be made prior to the high voltage test to ensure that it is conducted under defined conditions.

It is clear that it is also possible that during mounting, i.e. during the first mechanical fixation of the circuit board, both electrodes remain electrically separated and are only electrically connected to the housing and to the circuit board, respectively, after the high voltage test. Further, the capacitor may be inserted in a plug-in position of the holder only after the high voltage test.

As already mentioned, the capacitors may be made as anti-interference capacitors, i.e. suppress undesired high frequency oscillations in operation of the electronic device.

Other features and advantages of the present disclosure will become apparent to one with skill in the art upon examination of the following drawings and the detailed description. It is intended that all such additional features and advantages be included herein within the scope of the present disclosure, as defined by the claims.

BRIEF DESCRIPTION OF THE DRAWINGS

The present disclosure can be better understood with reference to the following drawings. The components in the drawings are not necessarily to scale, emphasis instead being placed upon clearly illustrating the principles of the present disclosure. The embodiments shown in the accompanying drawings are intended to be just illustrating but not limiting the present disclosure.

FIG. 3 is a schematic drawing of a further holder for a circuit board, the holder comprising a capacitor, a movable contact pin and a plug-in connector.

DETAILED DESCRIPTION

Figure 1:
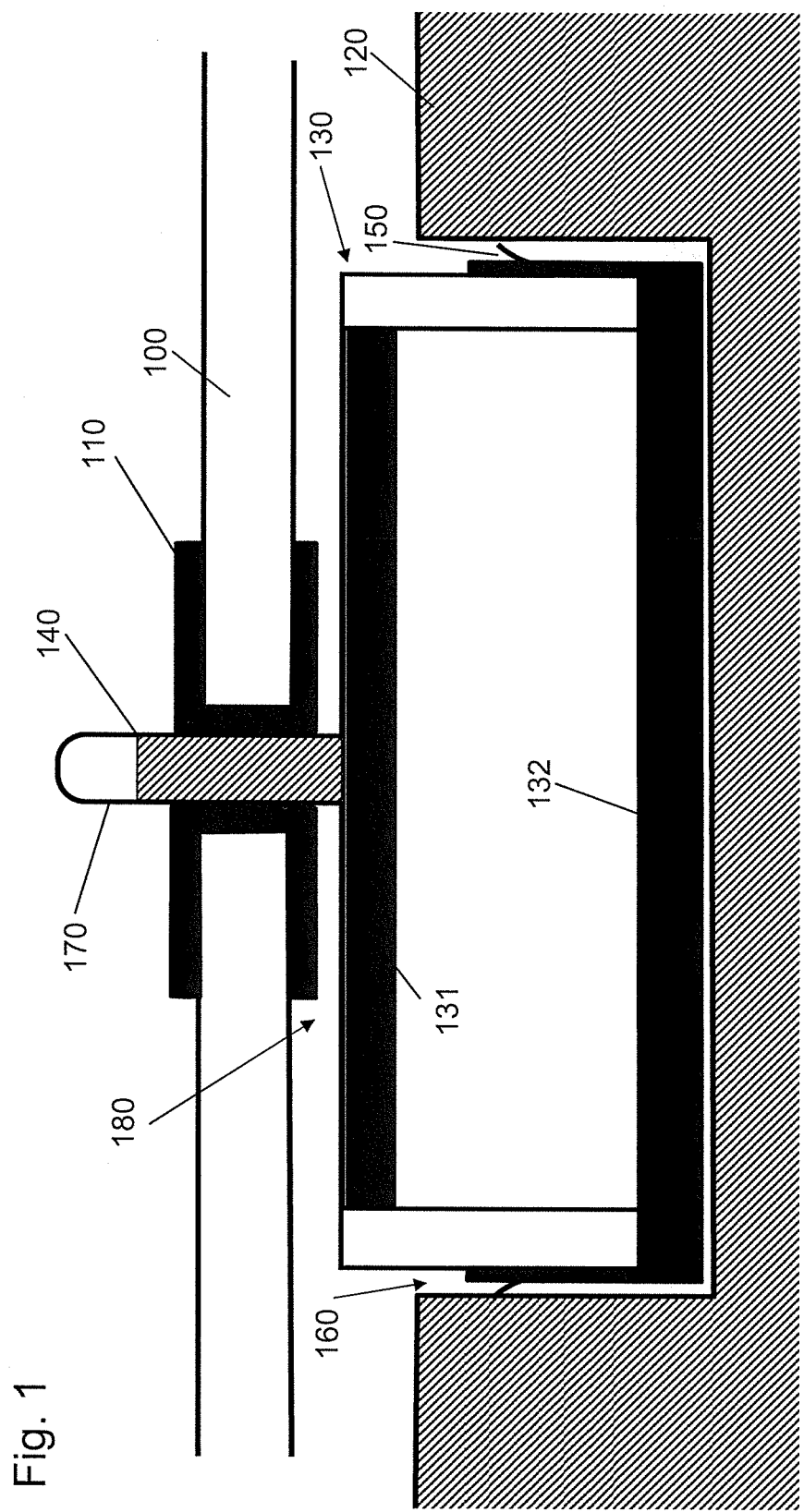
FIG. 1 is a schematic drawing of a first holder for a circuit board, the holder comprising a capacitor, a contact pin and a plug-in connector.

FIG. 1 shows a holder 180 for a circuit board 100 of an electronic device which includes a capacitor 130. The capacitor 130 comprises a first electrode 131 directly electrically connected to the circuit board 100 at a contact 110 via a contact pin 140. Here, the contact 110 is provided with an opening for receiving the contact pin 140. The direct electrical connection also mechanically fixes the capacitor to the circuit board.

A part of, for example, more than a half of the capacitor 130 is arranged in a recess 160 of a housing 120 of the electronic device. A second electrode 132 of the capacitor 130 is electrically connected to the housing 120 via one or more clamping noses 150, here. By being received in the recess 160 and by being electrically connected via the one or more clamping noses 150, both an electrical connection and a mechanical fixation of the capacitor 130 to the housing 120 is achieved. As a result the circuit board 100 is held in a defined position within the housing 120 via the capacitor 130, in which a distance between the circuit board 100 and a surface of the housing 120 is kept. In one embodiment, the shape of the recess 160 is adapted to the shape of the capacitor 130 so that it form-fits into the recess 160 as best as possible so that a good mechanical fixation of the capacitor 130 to the housing 120 is achieved.

The capacitor 130 is, in one embodiment, made as a film capacitor to ensure an as low as possible heat transfer from the housing to the circuit board. In this way, a condensation in the area of the contact 110 is effectively inhibited. Other types of capacitors with low heat conductivity may also be used.

The electrodes 131, 132 may be conductive elements, like for example metallic layers which are in direct contact with a dielectric of the capacitor 130 or which are used as collecting electrodes for conductive elements in the interior of the capacitor 130. In film capacitors, such a collecting electrode may particularly be the schoopage or contact the schoopage on both sides of the layered construction.

Optionally, the contact pin 140 comprises a section 170 made of a nonconductive material at its end facing away from the capacitor 130. Thus it is possible to at first only push the contact pin into the opening of the contact 110 to such an extent that due to the section 170 of the contact pin 140 there is a mechanical connection between the capacitor 130 and the circuit board 100 holding the circuit board 100 in place but not yet providing an electrical connection between the first electrode 131 and the contact 110. At a desired later point in time, the contact pin 140 may then be further pressed into the contact opening to such an extent that the electrical connection is also realized.

Instead of providing the contact pin 140 with a section 170 made of a nonconductive material, the contact pin 140 could be covered with a sleeve made of a nonconductive material (not depicted here) prior to pushing the contact pin into the opening of the contact 110. In this case, the circuit board 100 could be directly transferred into its final position with regard to the housing 120 without electrically connecting the contact 110 to the first electrode yet. This would allow for putting the circuit board 100 to any relevant high voltage test without stressing the capacitor 130. After carrying out the high voltage test, the sleeve would then be removed to provide the electric connection between the contact 110 and the first electrode required in operation of the electronic device.

Figure 2:
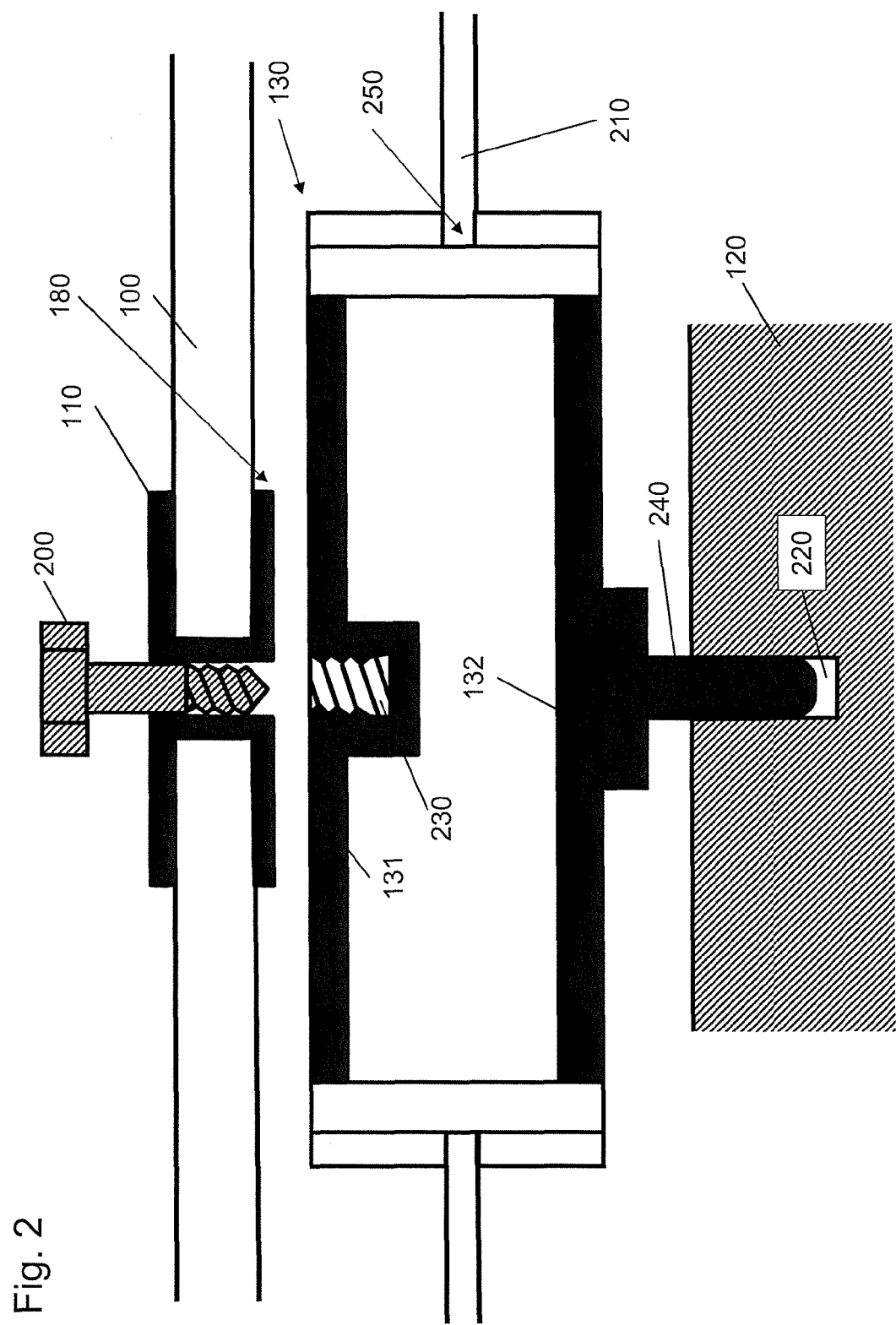
FIG. 2 is a schematic drawing of a second holder for a circuit board, the holder comprising a capacitor, a contact screw and a contact pin.

In FIG. 2, a second variant or embodiment of a capacitor 130 is depicted as a holder for a circuit board 100. Here, the electrical connection and the mechanical connection between the circuit board 100 and the capacitor 130 are made by a screw 200. The screw 200 is screwed into a corresponding thread 230 made as a part of the first capacitor electrode 131, and provides the electrical contact between the contact 110 and the first electrode 131 both via direct contact of these two components 110 and 131 and via its screw body. With a capacitor 130 made as a coiled capacitor having a hollow core, space for the thread 230 made as a part of the first capacitor electrode 131 is available in the area of the hollow core.

The second capacitor electrode 132 comprises a contact pin 240. The contact pin 240 extends into a recess 220 of the housing 120 being adapted to the contact pin 240, and provides an electrical connection between the second electrode 132 and the housing 120. Further, the contact pin 240 in the recess 220 provides for a sufficient mechanical fixation of the capacitor 130 to the housing 120. Here, the lower side of the capacitor may abut against the housing surface.

In this variant or embodiment, the capacitor further comprises a groove 250 in its circumference into which a film 210 protrudes. The film 210 extends in an area between the housing 120 and the circuit board 100. Such films are, for example, used as security measures to avoid an undesired short circuit between the circuit board 100 and the housing 120 when the circuit board 100 is subjected to bending loads. In a specific variant or embodiment not depicted here, the film 210 may also comprise an electrically conductive layer. In this case, the second electrode 132 optionally extends up to the groove 250 and provides an electrical connection between the layer and the housing 120. Such a construction allows for an additional electromagnetic shielding of housing areas or of device components arranged therein from each other, particularly if they are mounted in a stacked way.

A third variant or embodiment of the disclosure is depicted in FIG. 3. Here, the first electrode 131 of the capacitor 130 is electrically connected to the contact 110 on the circuit board 100 via a contact pin 400. The contact pin 400 is connected to the contact 110 on the circuit board in a mechanically fixed way, like for example via a plug-in connection or via a soldered connection. For both an electrical and a mechanical connection, the lower end of the contact pin 400 is pressed into a form-fitted recess 320 in the first electrode 131. As in the embodiment shown in FIG. 1, the lower part of the body of the capacitor 130 is arranged within a correspondingly dimensioned recess 160 of the housing 120.

Optionally, the capacitor 130 comprises an isolating layer 330 covering the first electrode 131. Then, the recess 320 extends through this isolating layer 330. The thickness of the isolating layer 330 is such that it is possible in a first assembly step to arrange the circuit board 100 with the contact pin 400 on the capacitor 130 such that the contact pin 400 is only inserted into the recess 320 to such an extent that a mechanical connection between the circuit board 100 and the capacitor 130 is made but no electrical connection with the capacitor electrode 131 is provided.

In one embodiment, a positioning help is provided which ensures a defined limited press-in depth of the contact pin 400 into the isolating layer 330 in the first assembly step. The positioning help may for example be realized by a taper of the diameter of the recess 320 in the lower area of the isolating layer 330 or by a variation of the diameter of the contact pin 400 (not depicted).

Figure 4A:
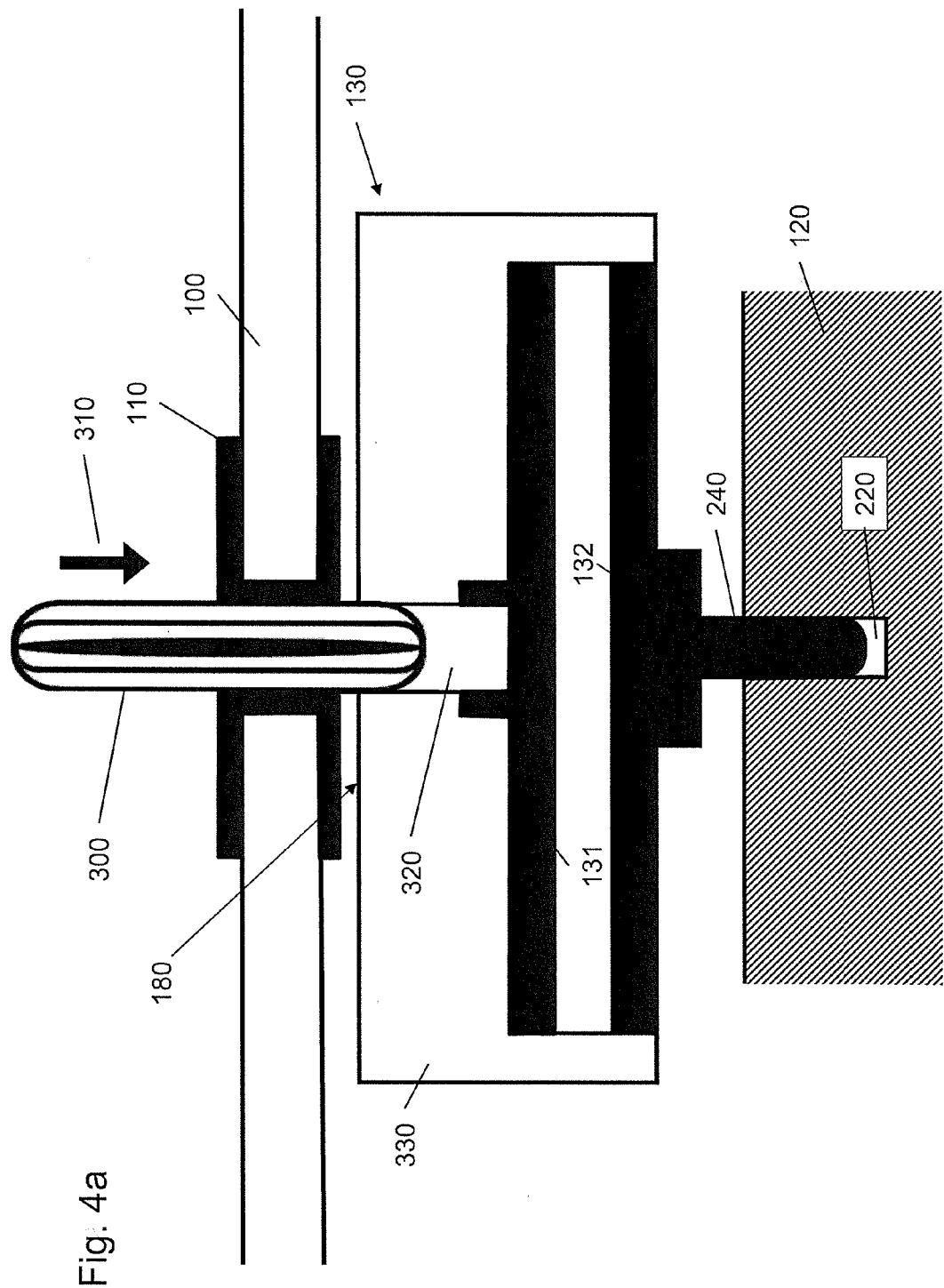
FIG. 4a is a schematic drawing of an arrangement of a circuit board and a capacitor and of a movable contact pin of a holder in a first position.
Figure 4B:
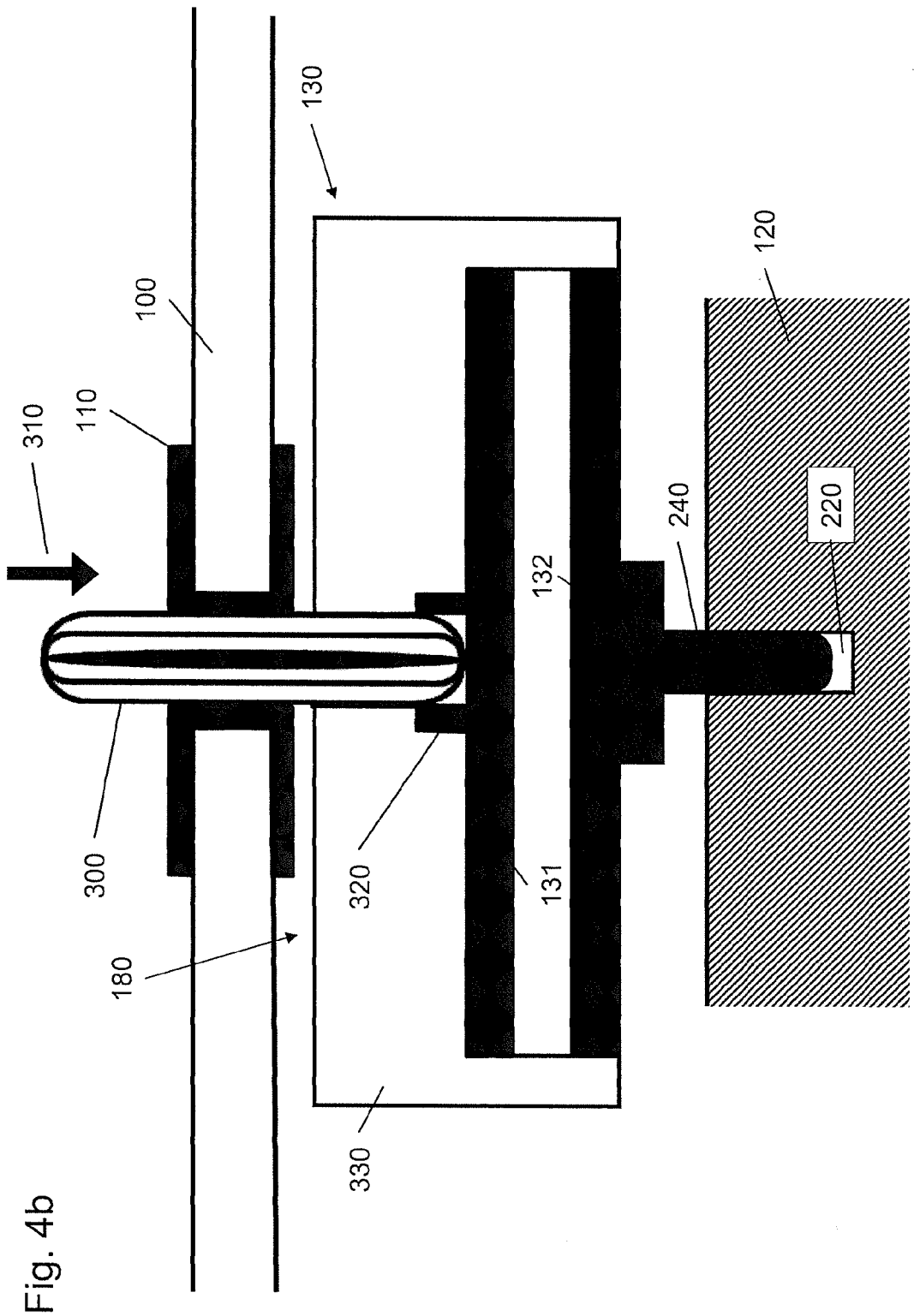
FIG. 4b is a schematic drawing of the arrangement according to FIG. 4a with the movable contact pin of the holder being in a second position.

The option of mechanically supporting the circuit board 100 by the capacitor 130 serving as a holder without electrically connecting the capacitor electrode 131 to the circuit board 100 is also implemented in the fourth variant or embodiment according to FIG. 4a and FIG. 4b. Here, the contact pin 400 of FIG. 3 is replaced by a movable contact pin 300. In its first position according to FIG. 4a, the contact pin 300 extends through an opening in the contact 110 of the circuit board 100 to such an extent that it projects into a recess 320 of the capacitor 130 and provides a mechanical connection but without electrically contacting the electrode 131. This is provided by an isolating layer 330 which covers the first electrode 131 and which comprises an appropriate thickness for mechanically accepting the contact pin 300 without electrically connecting it to the first electrode 131.

In a second position according to FIG. 4b, the contact pin 300 is then pressed in a press-in direction 310 into the recess 320 to such an extent that both a mechanical and a direct electrical connection between the circuit board 100 and the electrode 131 are provided by the contact pin 300.

When supporting the circuit board 100 via a plurality of holders according to the present disclosure, this press-in step may be executed separately for each contact pin or in a common or simultaneous press-in step for several or all contact pins. Again, positioning helps (not depicted), like for example suitable changes in diameter either of the contact pin 300 and/or of the recess 320 as explained with reference to FIG. 3, may ensure the process-security of the assembly here, particularly with regard to the press-in step.

Figure 5:
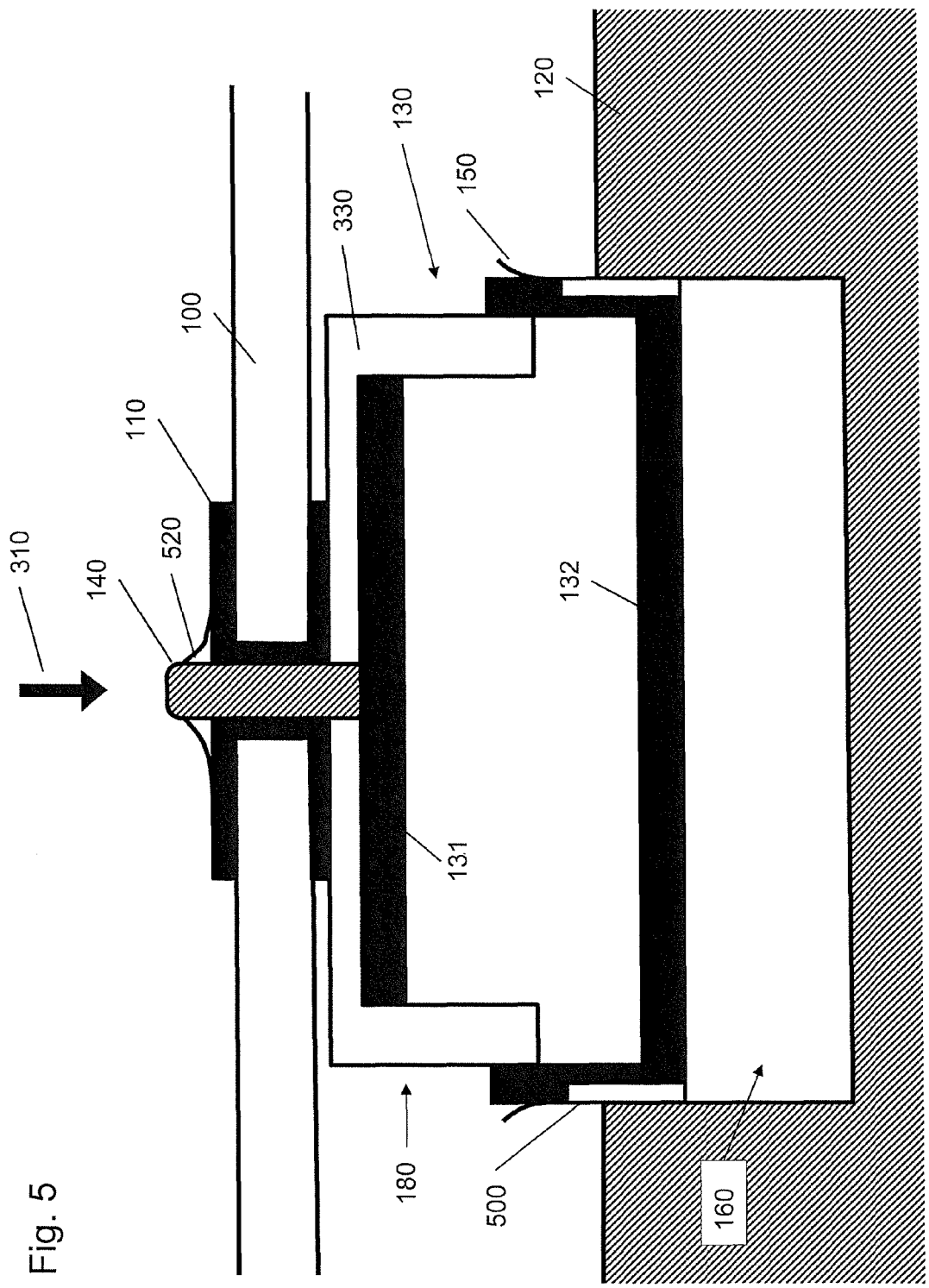
FIG. 5 is a schematic drawing of a further holder for a circuit board, the holder comprising a capacitor, a soldered contact pin and a plug-in connector.

The capacitor structure depicted in FIG. 5 allows for a mechanical support of the circuit board 100 via the capacitor 130 serving as a holder without electrically connecting the second capacitor electrode 132 to the housing 120. Here, the contact pin 140 protruding from the first electrode 131 of the capacitor 130 is fixed to the contact 110 on the circuit board 100 via a soldered connection 520, like for example an eyelet. Thus, the capacitor 130, with its first electrode 131, is both mechanically and electrically connected to the circuit board 100. In a first step, the capacitor 130 is now only inserted into a fitted recess 160 in the housing 120 to such an extent that an isolating layer 500 which covers a section of the second capacitor electrode 132 still electrically separates the second capacitor electrode 132 from the housing 120. In this position there is already a mechanical support to the circuit board 100 by the capacitor 130. At a desired later point in time, the capacitor 130 is then pressed deeper into the recess 160 in the press-in direction 310 so that an additional electrical contact between the second electrode 132 and the housing 120 is made by means of the clamping noses 150. Even here, a positioning help ensuring a defined press-in depth of the capacitor 130 into the housing 120 in the first step, like for example by means of an increase of the press-in force, is an advantage. Such a positioning help may for example be realized by appropriate rip-shaped structures (not depicted) either at the envelope of the capacitor 130 or at the inner wall of the recess 160.

Figure 6:
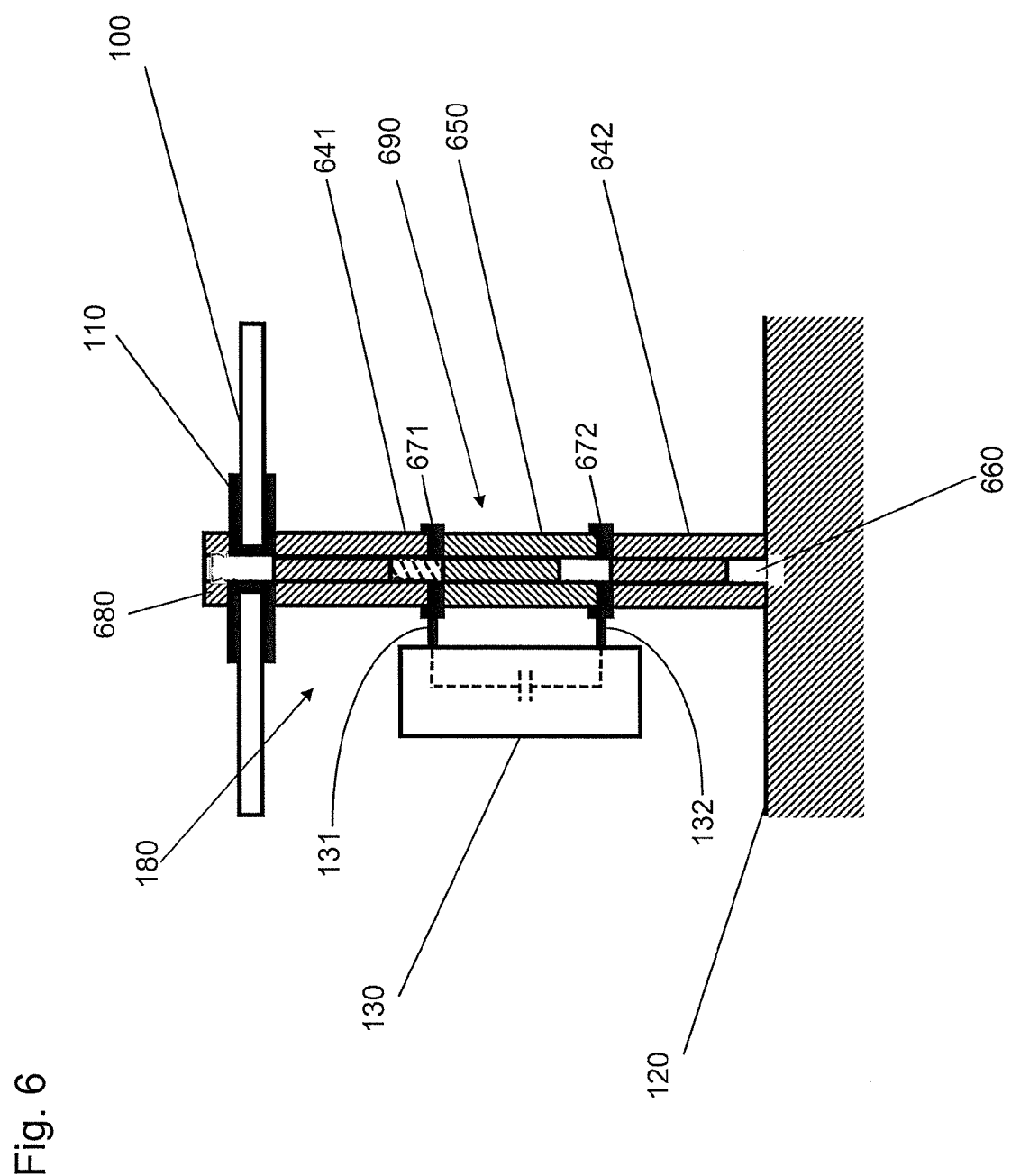
FIG. 6 is a schematic drawing of a further holder for a circuit board, the holder being based on distance bolts and comprising a capacitor.

The holder 180 depicted in FIG. 6 comprises a supporting structure 690 which is independent of the capacitor 130. The supporting structure 690 is partially connected in parallel to the capacitor 130 and comprises connectors to the circuit board 100 and the housing 120. The supporting structure 690 includes two electrically conductive distance bolts 641 and 642 of metal between which a thermally insulating and electrically isolating distance bolt 650 is arranged. The distance bolt 642 is screwed onto a connection thread 660 which protrudes from the housing 120. The distance bolt 650 is screwed onto the distance bolt 642 with an electrically conductive punched disc 672 being arranged in between. The punched disc 672 is in electrical contact with the electrode 132 of the capacitor 130. The distance bolt 641 is screwed onto the distance bolt 650 with a further electrically conductive punched disc 671 being arranged in between. The punched disc 671 is electrically connected to the electrode 131 of the capacitor 130. A connection thread of the distance bolt 641 protrudes through the circuit board 100 in the area of the contact 110, where it is inserted into a nut 680. The supporting structure 690 of the holder 180 formed of the distance bolts 641, 642 and 650 comprises a thermal insulation and electrical isolation due to the distance bolt 650. The distance bolt 650 is connected in parallel to the capacitor 130. Due to its dielectric, the capacitor 130 does not annul the thermal insulation of the holder 180 between its connections to the housing 120 and the circuit board 100. At least, the capacitor does not essentially reduce the thermal insulation, and the capacitor 130 provides a defined capacitive electrically coupling between these two connections.

Figure 7:
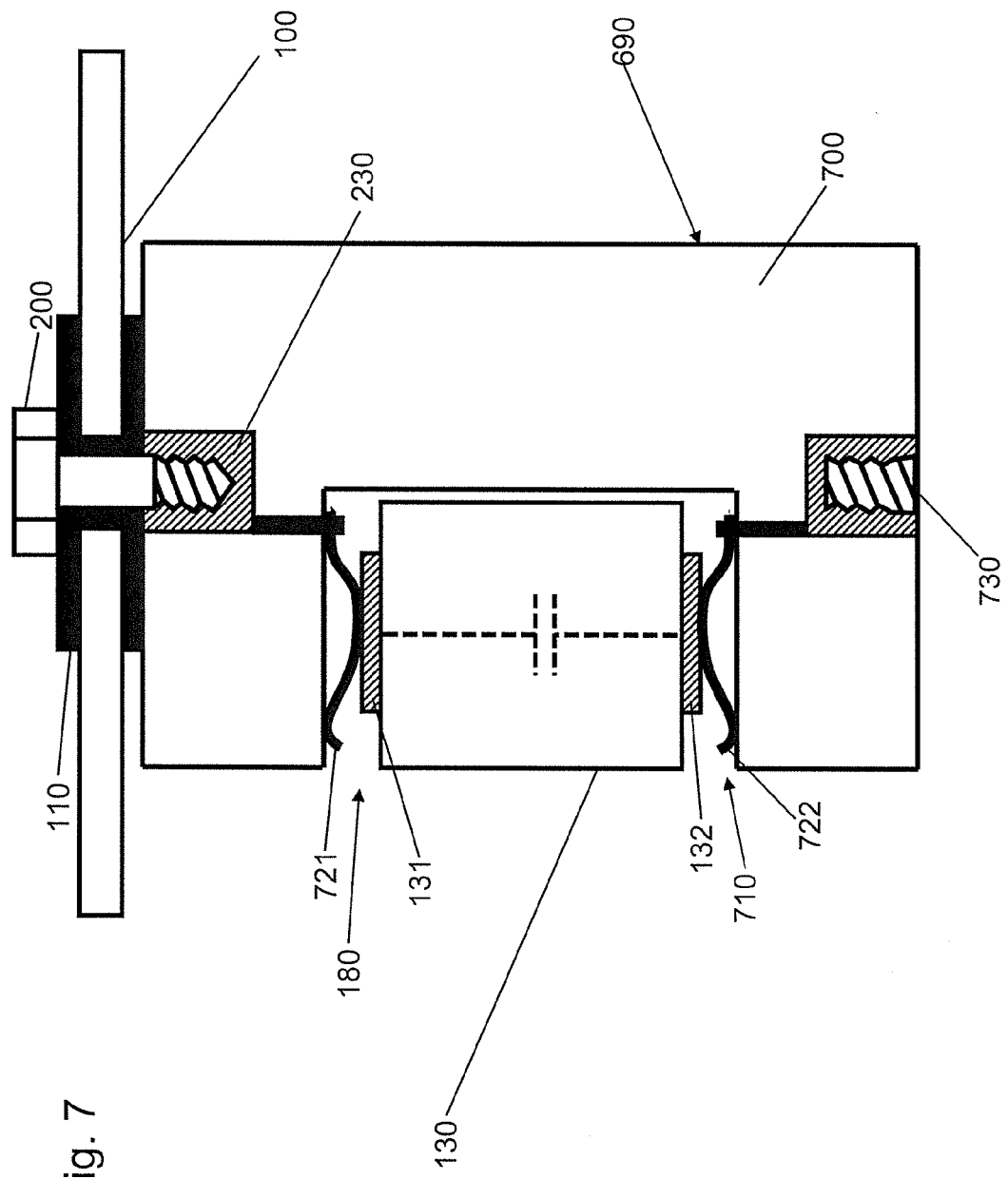
FIG. 7 is a schematic drawing of a further holder for a circuit board, the holder comprising a capacitor in a plug-in position.

FIG. 7 shows a circuit board 100 carrying an electrical contact 110 mechanically and electrically connected to a holder 180 via a contact screw 200. The holder 180 comprises a supporting structure 690 made of a thermally insulating and electrically isolating material 700. A plug-in position 710 for the capacitor 130 is provided in the supporting structure 690. In the plug-in position 710, the capacitor 130 is mechanically held and electrically contacted at its electrodes 131 and 132 by metallic contact springs 721 and 722. The contact spring 721 is in electrical contact with the electrically conductive thread 230 for the contact screw 200, whereas the contact spring 722 is provided with a thread 730 for screwing onto a securing thread protruding from the housing not depicted here. The capacitor 130 is a commercially available capacitor with end side electrodes 131 and 132 here. The capacitor 130 may be inserted into the plug-in place 710 prior to mounting, i.e., mechanically fixing the circuit board 100 by means of the supporting structure 690, or only after the mounting.

Figure 8:
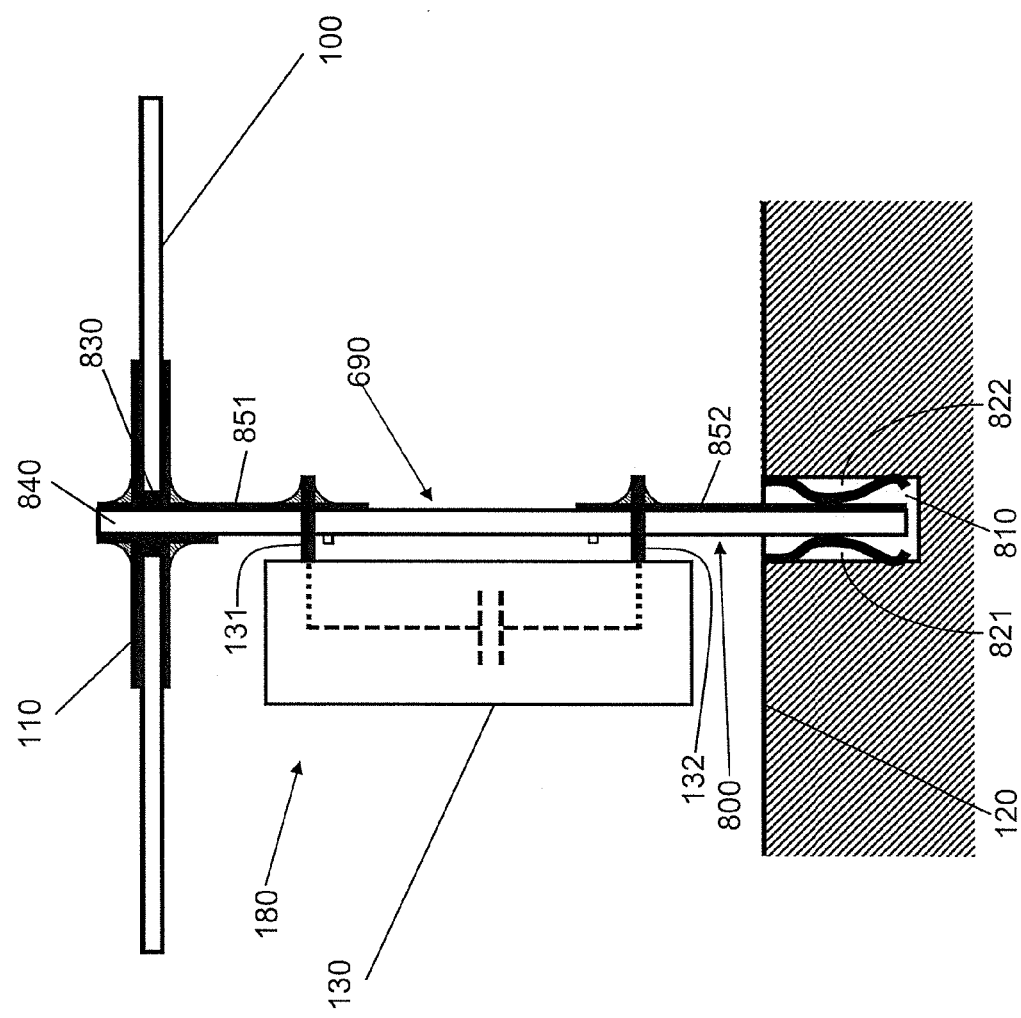
FIG. 8 is a schematic drawing of a further holder for a circuit board, the holder comprising a capacitor on a small circuit board.

In FIG. 8, the supporting structure 690 of the holder 180 is a small circuit board 800. The small circuit board 800 is plugged into a recess 810 of the housing 120 and mechanically held and electrically contacted therein by electrically conductive spring clamps 821 and 822. The mechanical and electrical connection of the small circuit board 800 to the circuit board 100 includes an extension 840 of the small circuit board 800 protruding through an opening 830 in the circuit board 100. At the opening 830 a circuit path 851 of the small circuit board 800 is soldered to the contact 110 on the circuit board 100. The capacitor 130, with its electrodes 131 and 132, is soldered to the circuit path 851 and to a further circuit path 852, respectively. The further circuit path 852 is in electrical contact with at least one of the spring clamps 821 and 822 and ensures an electrical connection between the second electrode 132 of the capacitor 130 and the metallic housing 120.

Figure 9:
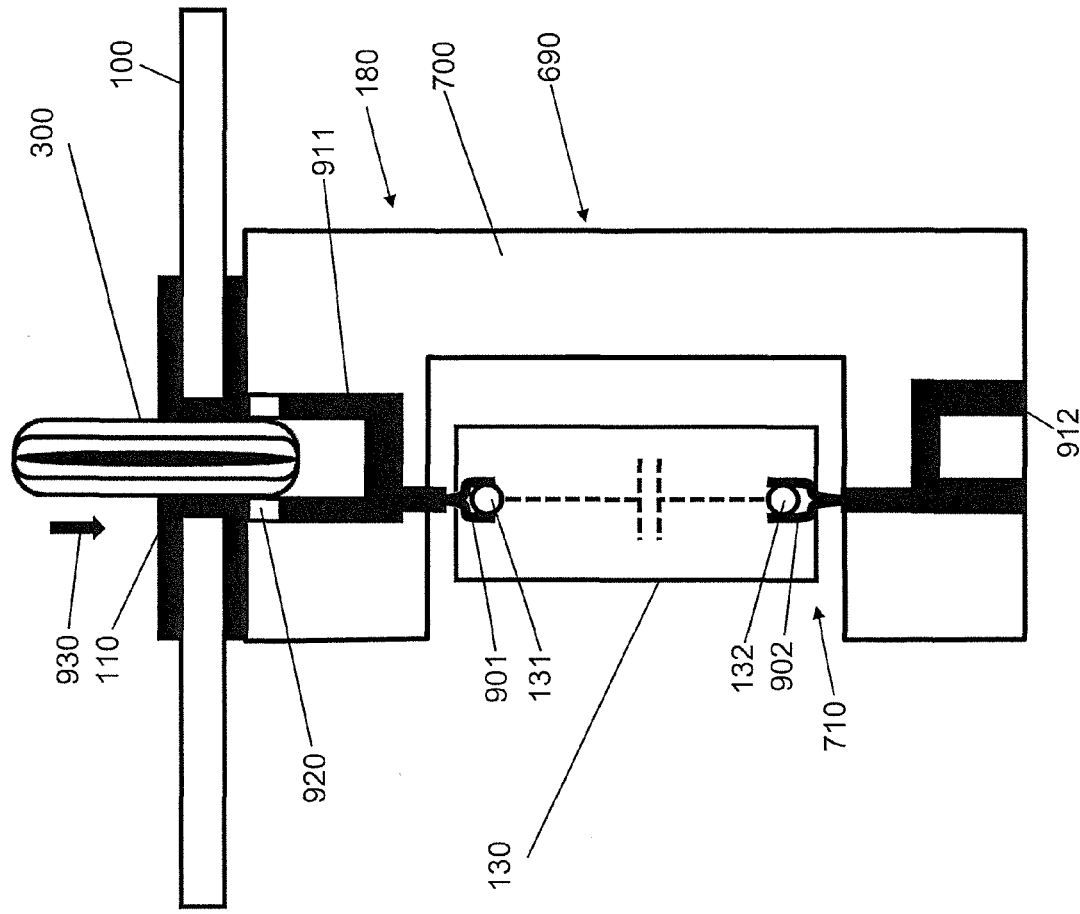
FIG. 9 is a schematic drawing of a further holder for a circuit board, the holder comprising a capacitor in a plug-in position which is contactable by a contact pin after mechanically fixing the circuit board.

FIG. 9 shows a further holder 180 comprising a supporting structure 690 made of a thermally insulating and electrically isolating material 700 and providing a plug-in position 710 for the capacitor 130. The plug-in position 710 is adapted to another constellation of the connection electrodes 131 and 132 of the capacitor 130. These pin-shaped electrodes 131 and 132 are contacted by metallic contacts springs 901 and 902 here. The contact springs 901 and 902 are in electrical contact with metal sleeves 911 and 912. The metal sleeve 911 is provided for receiving the contact pin 300 which—in the position according to FIG. 9, however—only extends through the circuit board 100 and—where touching the contact 110—engages an electrically isolating distance sleeve 920. Only when the contact pin 300 is further pressed-in in the direction of an arrow 930, it also engages the metal sleeve 911 and thus provides an electrical contact between the contact 110 and the electrode 131. The metal sleeve 912 is provided for being pressed on a complementary shaped contact pin protruding from the housing 120 but not depicted here.

In FIG. 9 both functions, the electrical connection between the first electrode 131 of the capacitor 130 and the contact 110 on the circuit board 100 and the mechanical connection of the circuit board 100 to the holder 180 are provided by the contact pin 300, only. In a variant or another embodiment of the holder 180 an additional connecting device (not shown) may be dedicated to a single function, i.e., to a primary mechanical fixation without electrically connecting the contact 110 of the circuit board 100 to the first electrode 131 of the capacitor 130. Such an additional connecting device can be realized by a profiled structure located on the upper surface of the supporting structure 690, e.g., by one or more small cylinders made of the same thermally insulating material 700 as the supporting structure 690. These small cylinders may be press-fitted into corresponding openings provided in the circuit board 100. Such a principle ensures a first mechanical fixation of the circuit board 100 relative to the supporting structure 690 (and therefore to the holder 180) already in a situation, when the contact pin 300 is not yet present or at least not yet protruding into the insulating sleeve 920 of the supporting structure 690. The electrical connection between the contact 110 of the circuit board 100 and the first electrode 131 of the capacitor 130 and a further mechanical fixation of the circuit board 100 to the holder 180 may then be made by pressing the contact pin 300 into the metal sleeve 911 of the supporting structure 690 later on (e.g., after the conduction of the high voltage test). This embodiment of the holder 180 may be advantageous as it already provides a sufficient mechanical fixation of the circuit board 100 to the holder 180 when no mechanical fixation is provided by the contact pin 300.

The same principle may also be applied to other holders, e.g. the holder 180 illustrated in FIG. 7. Here the entire mechanical connection and a part of the electrical connection between the first electrode 131 and the contact 110 of the circuit board 100 are made by screwing the screw 200 into the thread 230. When the screw 200 is not yet present, there is no mechanical fixation of the circuit board to the holder 180. Again, a primary mechanical fixation of the circuit board 100 to the holder 180 could be provided by additional elements protruding from the upper surface of the supporting structure 690 which are press-fitted in corresponding openings in the circuit board 100. If no electrical connection between the first electrode 131 and the contact 110 of the circuit board 100 is desired as long as the screw 200 is not present yet, e.g., for conducting a high voltage test without stressing the capacitor 131, an electrically insulating distance sleeve 920 (see FIG. 9) should be provided between the contact 110 of the circuit board 100 and the electrically conductive thread 230 to avoid their direct electrical contact.

Figure 10:
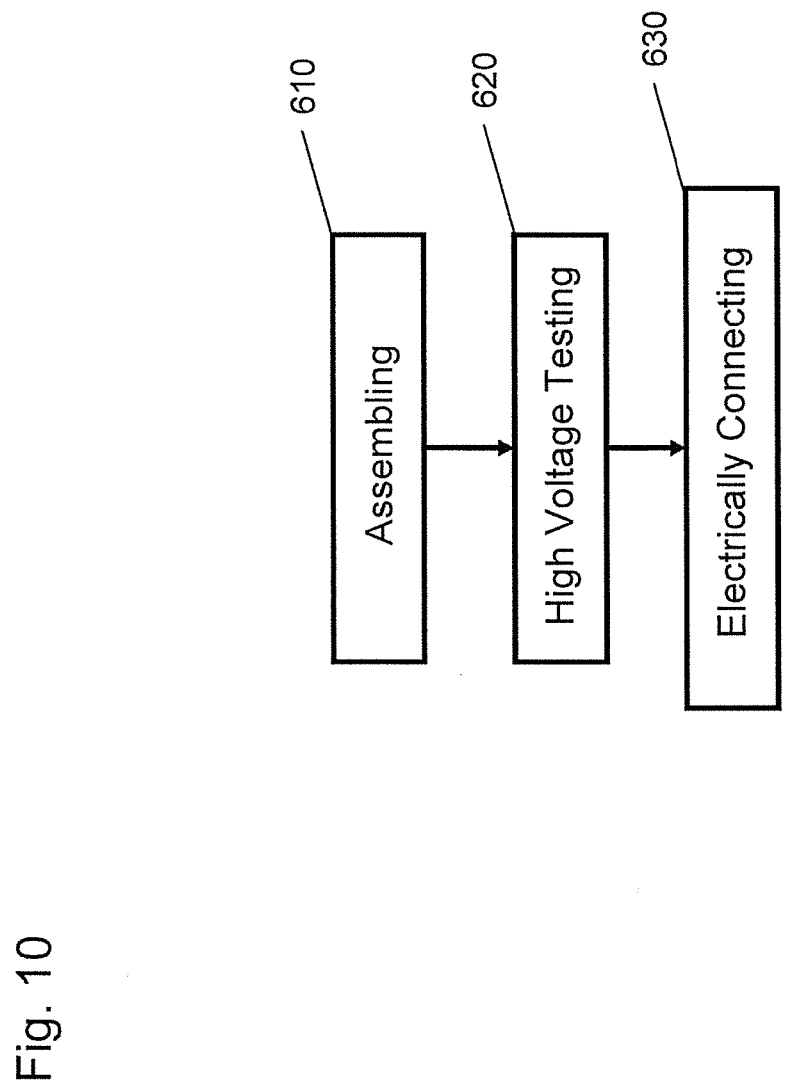
FIG. 10 is a flow diagram of a method of the present disclosure.

FIG. 10 is a flow diagram of the course of a manufacturing process according to the present disclosure for an electronic device. In a first act 610 the circuit board 100 is mounted within the housing 120 in such a way that a sufficient mechanical support is provided for the circuit board 100 but that no complete electrical connection of both capacitor electrodes 131, 132 to the circuit board 100 on the one hand and to the housing 120 on the other hand is provided yet. An electrical connection of a single electrode to its associated device component may already be provided here.

Afterwards, in a second act 620, the electronic device is put to a high voltage test. Due to the incomplete electrical connection of the capacitor 130, the capacitor 130 is not subjected to a voltage load during the high voltage test, and thus a failure of the capacitor 130 caused by a voltage overload is avoided.

In a third act 630, the electrical connections between the capacitor 130 and the circuit board 100 on the one hand and the housing 120 on the other hand are completed in that any up to now not yet contacted capacitor electrode 131, 132 is electrically connected to its associated device component. Depending on the embodiment of the capacitor 130, this may apply to either the first electrode 131 or the second electrode 132 or both. The electrical connections may be made by pressing a contact pin or a contact element into an opening or recess of the capacitor 130 or of the housing 120 or in a contact opening in the circuit board 100, but they may also be made by pressing the entire capacitor 130 into a recess 160 of the housing 120. Alternatively, a screw 200 may be screwed into a contact thread 230 of the capacitor 130. Particularly, if a plurality of capacitors 130 according to the present disclosure are provided as the only support for the circuit board 100 within the housing 120, the act 630 completing the electrical connections of both capacitor electrodes 131, 132 also finally mechanically fixes the circuit board and secures it against removal.

Advantageously, the electrical connections of the capacitor 130 are completed without any or just a very little change in position of the circuit board 100 relative to the housing 120 to ensure a validity of the results of the prior high voltage test for the final position of the circuit board 100 within the housing 120.

Many variations and modifications may be made to the embodiments of the disclosure without departing substantially from the spirit and principles of the disclosure. All such modifications and variations are intended to be included herein within the scope of the present disclosure, as defined by the following claims.

The invention claimed is:

1. An electronic device, comprising:
a housing,
a circuit board,
a plurality of holders including mechanical connectors to the housing and to the circuit board and mechanically fixing the circuit board within the housing, and
at least one capacitor including a first electrode, a second electrode and a dielectric arranged between the first and second electrodes, the first electrode being electrically connected to a contact on the circuit board and the second electrode being electrically connected to the housing,
wherein the at least one capacitor is part of one of the plurality of holders, its dielectric being part of a thermal insulation between the mechanical connectors to the circuit board and to the housing.

2. The electronic device of claim 1, wherein the one of the plurality of holders includes a supporting structure made of thermally insulating and electrically isolating material and connected in parallel to the dielectric of the capacitor between the mechanical connectors.

3. The electronic device of claim 2, wherein a plug-in position for the capacitor is provided in the supporting structure.

4. The electronic device of claim 1, wherein the one of the plurality of holders includes a small circuit board.

5. The electronic device of claim 1, wherein the at least one capacitor is a film capacitor.

6. The electronic device of claim 1, wherein the plurality of holders comprise at least three holders provided for the circuit board.

7. The electronic device of claim 1, wherein the mechanical connectors of the one of the plurality of holders electrically connect the at least one capacitor to the contact on the circuit board and to the housing.

8. The electronic device of claim 7, wherein the mechanical connector to the housing of the one of the plurality of holders comprises a press-in or screw connection electrically connecting the second electrode of the capacitor to the housing.

9. The electronic device of claim 7, wherein the mechanical connector to the circuit board of the one of the plurality of holders comprises a press-in or screw connection electrically connecting the first electrode of the capacitor to the contact on the circuit board.

10. The electronic device of claim 1, wherein the mechanical connector to the circuit board of the one of the plurality of holders comprises a connection element providing a mechanical fixation of the circuit board in its final position within the housing without electrically connecting the first electrode of the capacitor to the contact on the circuit board.

11. The electronic device of claim 1, wherein a contact pin or a contact screw electrically connects the first electrode of the capacitor to the contact on the circuit board.

12. The electronic device of claim 11, wherein the contact pin or the contact screw is movable to electrically contact the first electrode of the capacitor to the contact on the circuit board with the circuit board being mechanically fixed by the holders.

13. The electronic device of claim 1, wherein a soldered electrical connection is provided between the first electrode of the capacitor and the contact on the circuit board.

14. The electronic device of claim 1, wherein, in operation of the electronic device, a voltage of more than 400 volts drops over the capacitor.

15. The electronic device of claim 1, wherein the one of the plurality of holders including the capacitor is by more than half of its height received in a recess of the housing.

16. The electronic device of claim 1, wherein the at least one capacitor is an anti-interference capacitor.

* * * * *